(12) United States Patent
Kihara

(10) Patent No.: US 8,847,708 B2
(45) Date of Patent: Sep. 30, 2014

(54) MEMS VIBRATOR AND OSCILLATOR

(75) Inventor: Ryuji Kihara, Matsumoto (JP)

(73) Assignee: Seiko Epson Corporation (JP)

( * ) Notice: Subject to any disclaimer, the term of this patent is extended or adjusted under 35 U.S.C. 154(b) by 361 days.

(21) Appl. No.: 13/431,354

(22) Filed: Mar. 27, 2012

(65) Prior Publication Data

US 2012/0249253 A1    Oct. 4, 2012

(30) Foreign Application Priority Data

Mar. 30, 2011   (JP) ................. 2011-075808

(51) Int. Cl.
  *H03H 9/24*   (2006.01)
  *H03H 9/125*  (2006.01)
  *H03H 9/52*   (2006.01)
  *H03H 3/007*  (2006.01)

(52) U.S. Cl.
  CPC ........... *H03H 3/0072* (2013.01); *H03H 9/2457* (2013.01)
  USPC ....... 333/186; 333/200; 331/116 M; 331/156; 257/415; 310/309

(58) Field of Classification Search
  USPC ........... 333/186, 197, 200; 310/309; 257/415; 331/116 R, 116 M, 156
  See application file for complete search history.

(56) References Cited

U.S. PATENT DOCUMENTS

| | | | |
|---|---|---|---|
| 6,831,531 B1 | 12/2004 | Giousouf et al. | 333/200 |
| 7,654,139 B2 | 2/2010 | Watanabe et al. | 73/504.12 |
| 7,705,693 B2 | 4/2010 | Davis | 383/186 |
| 8,026,120 B2 | 9/2011 | Kihara et al. | 438/58 |
| 8,587,390 B2 * | 11/2013 | Kihara | 333/186 |
| 2003/0062961 A1 * | 4/2003 | Ma et al. | 331/100 |
| 2007/0279140 A1 | 12/2007 | Davis | 331/154 |
| 2011/0306153 A1 | 12/2011 | Kihara et al. | 438/10 |
| 2012/0146736 A1 * | 6/2012 | Kihara | 331/156 |
| 2013/0168782 A1 * | 7/2013 | Jahnes et al. | 257/415 |

FOREIGN PATENT DOCUMENTS

| | | |
|---|---|---|
| JP | 2000-337880 | 12/2000 |
| JP | 2003-133897 | 5/2003 |
| JP | 2004-515992 | 5/2004 |
| JP | 2006-284551 | 10/2006 |
| JP | 2007-139505 | 6/2007 |
| JP | 2010-162629 | 7/2010 |

* cited by examiner

*Primary Examiner* — Barbara Summons
(74) *Attorney, Agent, or Firm* — Harness, Dickey & Pierce, P.L.C.

(57) ABSTRACT

A MEMS vibrator according to the invention includes: a first electrode fixed to a surface of a substrate; and a second electrode having a beam portion including a second face facing a first face of the first electrode, and a supporting portion supporting the beam portion and fixed to the surface of the substrate. The beam portion has a first portion whose length in a normal direction of the first face of the beam portion monotonically decreases toward a tip of the beam portion.

9 Claims, 12 Drawing Sheets

MEMS VIBRATOR AND OSCILLATOR

BACKGROUND

1. Technical Field

The present invention relates to a MEMS vibrator and an oscillator.

2. Related Art

MEMS (Micro Electro Mechanical Systems), which are one of techniques for forming a minute structure, mean a technique for making a micro electro mechanical system in the order of microns, or the product thereof, for example.

JP-A-2010-162629 discloses a MEMS vibrator having a fixed electrode and a movable electrode, in which the movable electrode is driven by electrostatic force generated between the electrodes. Output of such an electrostatic-type MEMS vibrator is generated by a change in capacitance between the fixed electrode and the movable electrode when the MEMS vibrator is driven. Therefore, the larger the crossing area (area of a region where the electrodes overlap each other) of the fixed electrode and the movable electrode is, the higher the output is.

On the other hand, a driving frequency is a natural frequency of a vibrator, and determined by the shape and dimensions of the vibrator. Various shapes of MEMS vibrators driven in a frequency band from several kHz to several GHz have been proposed so far. In the case of the vibrator having a cantilevered structure disclosed in JP-A-2010-162629, the driving frequency is determined by the length and thickness of a beam portion (movable electrode). When the thickness is constant, the great length of the beam portion makes the frequency low, and the small length thereof makes the frequency high.

However, when it is intended to drive the vibrator at a high frequency, the crossing area of the fixed electrode and the beam portion is reduced because of the small length of the beam portion, resulting in low output in some cases. This means that when the vibrator is considered as an equivalent circuit, the series resistance is high. When the MEMS vibrator is used for an oscillator for example, phase reversal is insufficient as the resistance is increased, failing to satisfy oscillation conditions in some cases.

SUMMARY

An advantage of some aspects of the invention is to provide a MEMS vibrator having high output and driven at a high frequency. Another advantage of some aspects of the invention is to provide an oscillator having the MEMS vibrator described above.

An aspect of the invention is directed to a MEMS vibrator including: a first electrode fixed to a surface of a substrate; and a second electrode having a beam portion including a second face facing a first face of the first electrode, and a supporting portion supporting the beam portion and fixed to the surface of the substrate, wherein the beam portion has a first portion whose length in a normal direction of the first face of the beam portion monotonically decreases toward a tip of the beam portion.

According to the MEMS vibrator described above, the mass of the beam portion can be reduced without reducing a region (crossing area) where the first electrode overlaps the beam portion. That is, it is no need to reduce the capacitance between the first electrode and the beam portion for driving the MEMS vibrator at a high frequency. Accordingly, the MEMS vibrator described above has high output and can be driven at a high frequency.

In the MEMS vibrator according to the aspect of the invention, the beam portion may have a second portion whose length in the normal direction of the beam portion is constant, the first portion may include the tip, the second portion may be contiguous with the first portion and supported by the supporting portion, and the MEMS vibrator may satisfy the following expression (1):

$$1/10 \leq L_2/L \leq 1/2 \tag{1}$$

where L is the length of a region of the beam portion overlapping the first electrode, in a direction from the supporting portion toward the tip, and $L_2$ is the length of a region of the second portion overlapping the first electrode, in the direction from the supporting portion toward the tip.

According to the MEMS vibrator described above, driving at a higher frequency is possible (the details will be described later).

In the MEMS vibrator according to the aspect of the invention, the normal of the first face may be parallel to the normal of the surface of the substrate.

According to the MEMS vibrator described above, output is high, and driving at a high frequency is possible.

In the MEMS vibrator according to the aspect of the invention, the normal of the first face may be perpendicular to the normal of the surface of the substrate.

According to the MEMS vibrator described above, output is high, and driving at a high frequency is possible.

Another aspect of the invention is directed to an oscillator including the MEMS vibrator according to the aspect of the invention.

According to the oscillator described above, the series resistance can be prevented from being increased, and the phase can be reversed. Accordingly, the oscillator described above can satisfy oscillation conditions, and therefore can stably oscillate the MEMS vibrator according to the aspect of the invention at a high frequency.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a preferred embodiment of the invention will be described with reference to the drawings.

1. MEMS Vibrator

Figure 1:
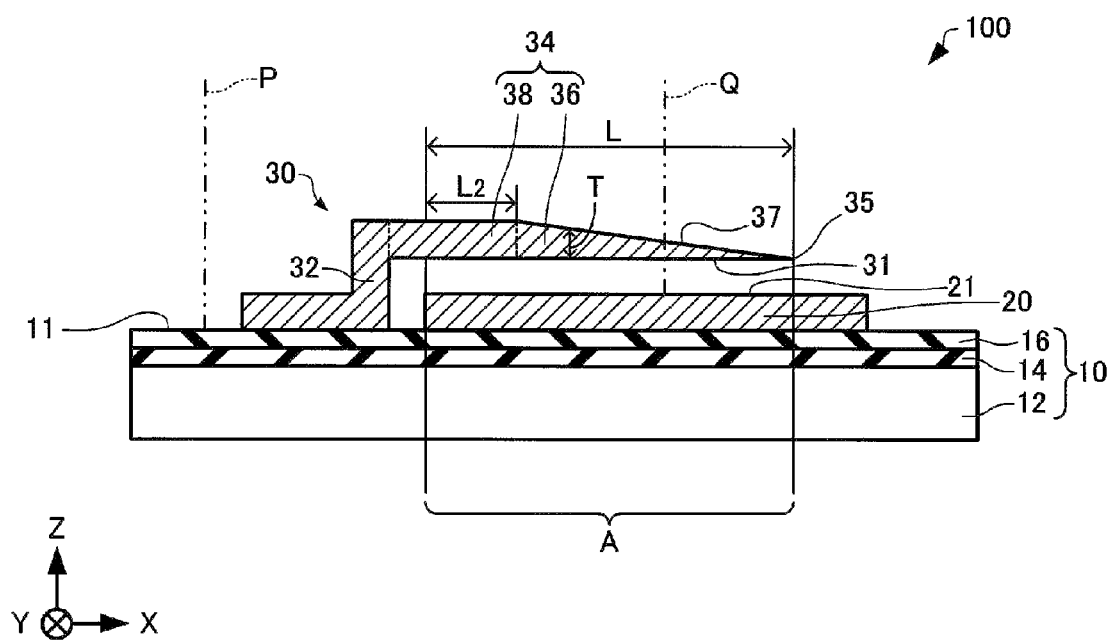
FIG. 1 is a cross-sectional view schematically showing a MEMS vibrator according to an embodiment.
Figure 2:
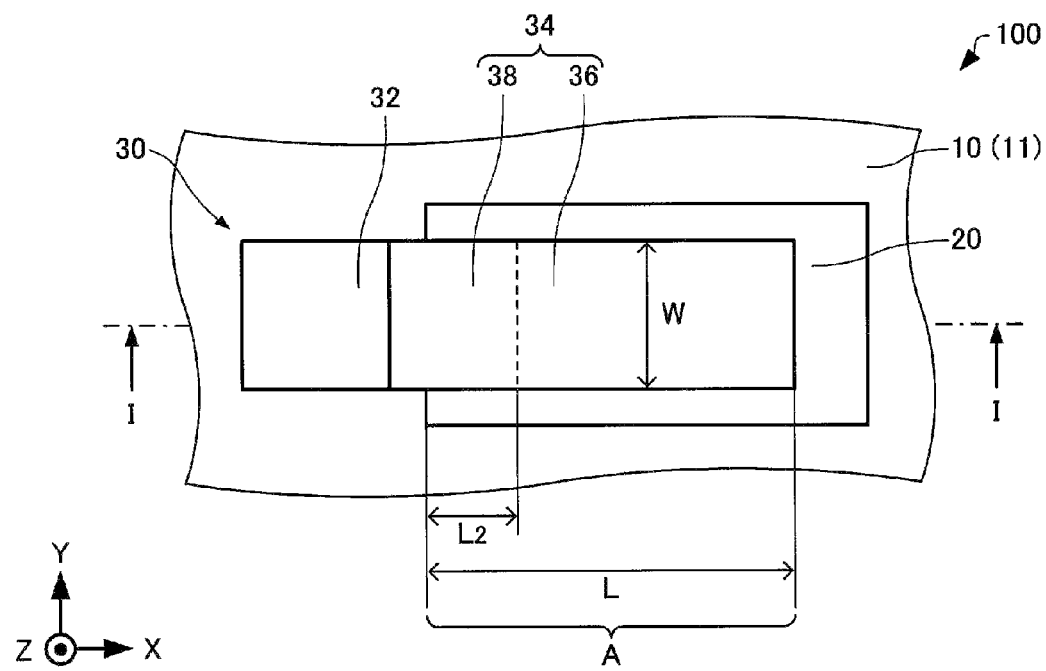
FIG. 2 is a plan view schematically showing the MEMS vibrator according to the embodiment.

First, a MEMS vibrator according to the embodiment will be described with reference to the drawings. FIG. 1 is a cross-sectional view schematically showing a MEMS vibrator 100 according to the embodiment. FIG. 2 is a plan view schematically showing the MEMS vibrator 100 according to the embodiment. FIG. 1 is the cross-sectional view taken along line I-I of FIG. 2.

As shown in FIGS. 1 and 2, the MEMS vibrator 100 includes a substrate 10, a first electrode 20, and a second electrode 30. As shown in FIG. 1, the substrate 10 can have a supporting substrate 12, a first under layer 14, and a second under layer 16.

As the supporting substrate 12, a semiconductor substrate such as a silicon substrate, for example, can be used. As the supporting substrate 12, various types of substrates such as a ceramics substrate, a glass substrate, a sapphire substrate, a diamond substrate, or a synthetic resin substrate may be used.

The first under layer 14 is formed on the supporting substrate 12. As the first under layer 14, a trench insulating layer, a LOCOS (Local Oxidation of Silicon) insulating layer, or a semi-recessed LOCOS insulating layer, for example, can be used. The first under layer 14 can electrically isolate the MEMS vibrator 100 from another element (not shown) formed in the supporting substrate 12.

The second under layer 16 is formed on the first under layer 14. The material of the second under layer 16 is silicon nitride, for example. The second under layer 16 can function as an etching stopper layer in a release step described later.

The first electrode 20 is formed on the substrate 10 and fixed to a surface 11 of the substrate 10. The planar shape (shape as viewed from a direction of the normal P of the surface 11 of the substrate 10) of the first electrode 20 is, for example, a rectangle as shown in FIG. 2. As shown in FIG. 1, the first electrode 20 has a first face 21. The first face 21, which can also be referred to as an upper face of the first electrode 20, is a flat face. The normal Q of the first face 21 is parallel to the normal P of the surface 11 of the substrate 10. The thickness (length in the Z-axis direction) of the first electrode 20 is, for example, from 0.1 μm to 100 μm.

The second electrode 30 is formed spaced apart from the first electrode 20. The second electrode 30 has a supporting portion 32 formed on the substrate 10, and a beam portion 34 supported by the supporting portion 32 and arranged above the first electrode 20.

The supporting portion 32 is fixed to the surface 11 of the substrate 10. The supporting portion 32 supports the beam portion 34. That is, the second electrode 30 is formed in a cantilevered manner.

The beam portion 34 has a second face 31 facing the first face 21 of the first electrode 20. More specifically, the second face 31 is parallel to the first face 21. That is, the normal Q of the first face 21 can be rephrased as the normal Q of the second face 31. The second face 31, which can also be referred to as a lower face of the beam portion 34, is a flat face. In plan view, the beam portion 34 overlaps the first electrode 20 in a region A. In the example shown in FIG. 2, the planar shape of the beam portion 34 is a rectangle with a length W (also referred to as "width W") in the Y-axis direction being as the length of its short side. The beam portion 34 has a first portion 36 and a second portion 38.

As shown in FIG. 1, the first portion 36 has a shape in which a length T (length in the Z-axis direction) in a direction of the normal Q of the first face 21 of the first electrode 20 decreases toward a tip 35 of the beam portion 34 (toward the +X-direction). In the illustrated example, the length T (also referred to as "thickness T") of the first portion 36 in the Z-axis direction monotonically decreases toward the tip 35. That is, the first portion 36 may be configured such that the length T in the Z-axis direction does not remain the same in any section on the way from the supporting portion 32 toward the tip 35 but continuously changes toward the tip 35. In short, the first portion 36 may have an inclined face 37 which is inclined to the first face 21 and the second face 31 as shown in FIG. 1. The cross-sectional shape of the first portion 36 may be a triangle. The first portion 36 can include the tip 35.

The first portion 36 is arranged in the region A of the beam portion 34 overlapping the first electrode 20. That is, in plan view (viewed from the normal-P-direction of the surface 11 of the substrate 10) as shown in FIG. 2, the first portion 36 is arranged inside the outer circumference of the first electrode 20. The planar shape of the first portion 36 may be a rectangle as shown in FIG. 2.

As shown in FIG. 1, the length T (length in the Z-axis direction) of the second portion 38 in the normal-Q-direction of the first face 21 of the beam portion 34 is constant. The second portion 38 is contiguous with the first portion 36 and supported by the supporting portion 32. The second portion 38 is adjacent to, for example, the supporting portion 32. The cross-sectional shape of the second portion 38 may be a rectangle as shown in FIG. 1. In the illustrated example, a portion of the second portion 38 is arranged in the region A of the beam portion 34 overlapping the first electrode 20. The planar shape of the second portion 38 may be a rectangle as shown in FIG. 2. The thickness (length in the Z-axis direction) of the second portion 38 is, for example, from 0.1 μm to 100 μm.

When it is defined that a length of the region A of the beam portion 34 overlapping the first electrode 20, in a direction from the supporting portion 32 toward the tip 35 (X-axis direction), is L, and that a length of the region A of the second portion 38 overlapping the first electrode 20, in the X-axis direction, is $L_2$, the MEMS vibrator 100 preferably satisfies the following expression (1). With this configuration, the MEMS vibrator 100 can be driven at a higher frequency (the details will be described later).

$$1/10 \leq L_2/L \leq 1/2 \tag{1}$$

The material of the first electrode 20 and the second electrode 30 is, for example, polycrystalline silicon doped with a predetermined impurity to provide conductivity. When a voltage is applied between the first electrode 20 and the second electrode 30, the beam portion 34 can be vibrated by electrostatic force generated between the electrodes 20 and 30. The first electrode 20 and the supporting portion 32 of the second electrode 30 can be connected to wiring (not shown) for applying a voltage between the electrodes 20 and 30.

Although not shown in the drawing, the MEMS vibrator 100 may have a covering structure which airtightly seals the first electrode 20 and the second electrode 30 in a reduced-pressure state. With this configuration, it is possible to reduce the air resistance of the beam portion 34 during its vibration.

The MEMS vibrator 100 according to the embodiment has, for example, the following features.

According to the MEMS vibrator 100, the beam portion 34 has the first portion 36 whose length T (length in the Z-axis direction) in the normal-Q-direction of the beam portion 34 decreases toward the tip 35 of the beam portion 34 (toward the +X-direction). That is, in the MEMS vibrator 100, the mass of the beam portion 34 can be reduced compared to the case where the length in the Z-axis direction is constant. Therefore, the mass of the beam portion 34 can be reduced without reducing the region A (crossing area) where the first electrode 20 overlaps the beam portion 34. In short, it is no need to reduce the capacitance between the first electrode 20 and the beam portion 34 for driving the MEMS vibrator at a high frequency. Accordingly, the MEMS vibrator 100 has high output and can be driven at a high frequency.

According to the MEMS vibrator 100, the length T of the first portion 36 of the beam portion 34 in the Z-axis direction can continuously change toward the tip 35. Therefore, it is possible to prevent the MEMS vibrator 100 from being driven in another driving mode different from a desired driving mode. For example, when the length of the beam portion in the Z-axis direction changes in a stepwise manner, the MEMS vibrator cannot be driven in a desired driving mode in some cases because another driving mode is generated in a step portion.

2. Manufacturing Method of MEMS Vibrator

Next, a manufacturing method of the MEMS vibrator according to the embodiment will be described with reference to the drawings. FIGS. 3 to 8 are cross-sectional views schematically showing manufacturing steps of the MEMS vibrator 100 according to the embodiment.

Figure 3:
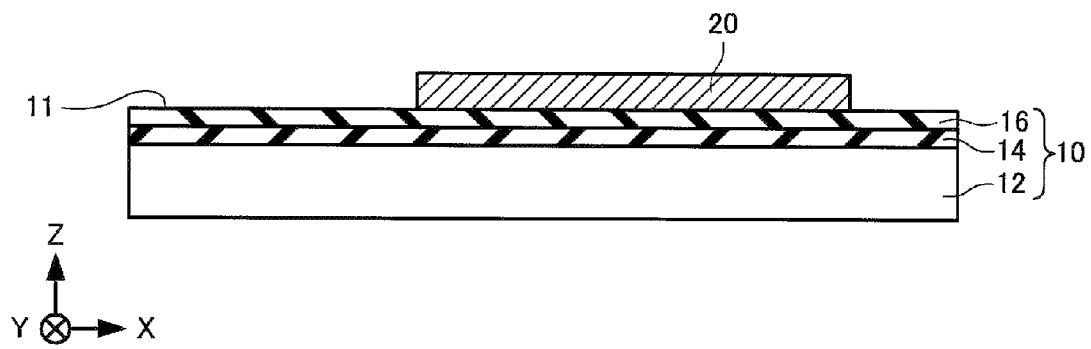
FIG. 3 is a cross-sectional view schematically showing a manufacturing step of the MEMS vibrator according to the embodiment.

As shown in FIG. 3, the first under layer 14 and the second under layer 16 are formed in this order on the supporting substrate 12 to obtain the substrate 10. The first under layer 14 is formed by, for example, an STI (Shallow Trench Isolation) method or a LOCOS method. The second under layer 16 is formed by, for example, a CVD (Chemical Vapor Deposition) method or a sputtering method.

Next, the first electrode 20 is formed on the substrate 10. More specifically, the first electrode 20 is formed by deposition by a CVD method, a sputtering method, or the like, and then by patterning using a photolithographic technique and an etching technique. Next, the first electrode 20 formed of, for example, polycrystalline silicon is doped with a predetermined impurity (for example, boron) to provide conductivity.

Figure 4:
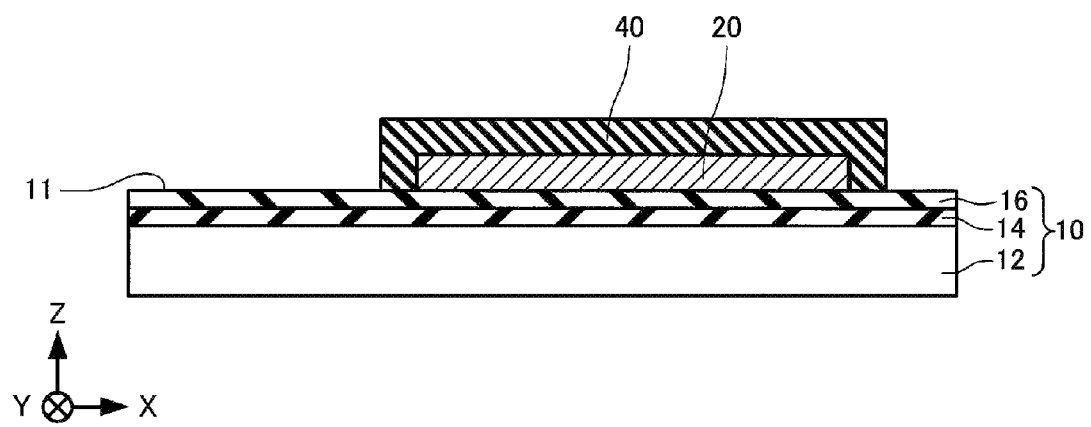
FIG. 4 is a cross-sectional view schematically showing a manufacturing step of the MEMS vibrator according to the embodiment.

As shown in FIG. 4, a sacrificial layer 40 is formed so as to cover the first electrode 20. The sacrificial layer 40 is formed by, for example, thermally oxidizing the first electrode 20. The material of the sacrificial layer 40 is, for example, silicon oxide. The thickness of the sacrificial layer 40 is, for example, from 0.01 μm to 100 μm. By the thickness of the sacrificial layer 40, a distance between the first face 21 of the first electrode 20 and the second face 31 of the beam portion 34 is determined.

Figure 5:
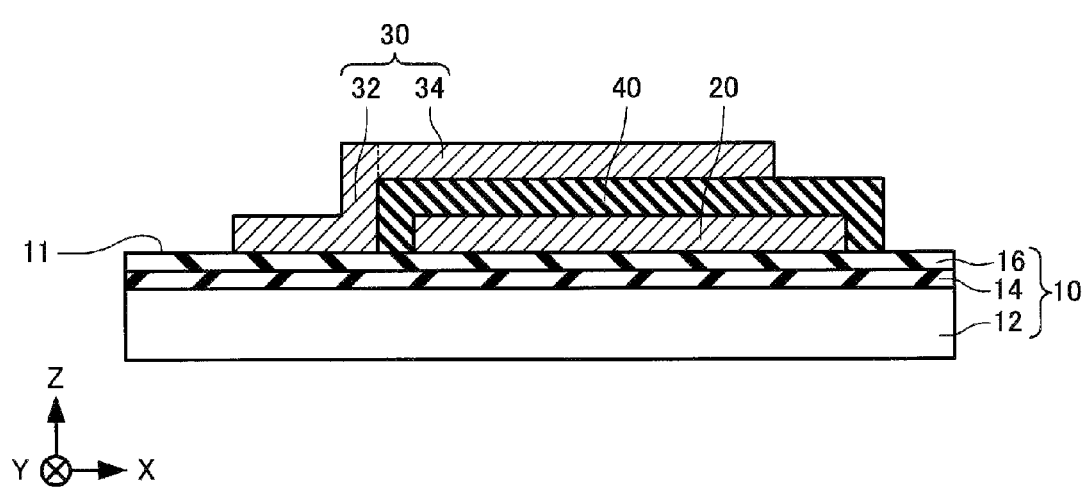
FIG. 5 is a cross-sectional view schematically showing a manufacturing step of the MEMS vibrator according to the embodiment.

As shown in FIG. 5, the second electrode 30 is formed on the sacrificial layer 40 and the substrate 10. More specifically, the second electrode 30 is formed by deposition by a CVD method, a sputtering method, or the like, and then by patterning using a photolithographic technique and an etching technique. Next, the second electrode 30 formed of polycrystalline silicon is doped with a predetermined impurity (for example, boron) to provide conductivity. Through the steps described above, the second electrode 30 having the beam portion 34 and the supporting portion 32 is formed.

Figure 6:
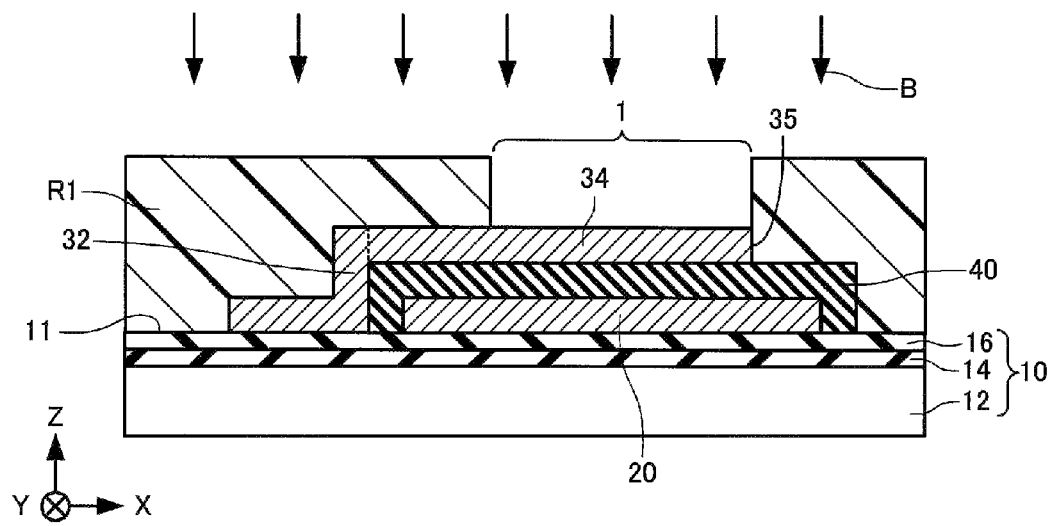
FIG. 6 is a cross-sectional view schematically showing a manufacturing step of the MEMS vibrator according to the embodiment.

As shown in FIG. 6, a first resist layer R1 having a first opening 1 is formed on the beam portion 34 by, for example, a known method. In the illustrated example, the end of the first opening 1 overlaps the tip 35 of the beam portion 34. The length of the first opening 1 in the X-axis direction may be the same as the length (that is, the length L shown in FIGS. 1 and 2) of the first portion 36 of the beam portion 34 in the X-axis direction.

Next, the beam portion 34 is doped with a predetermined impurity B (for example, boron) using the first resist layer R1 as a mask (a first doping step for the beam portion 34). Thereafter, the first resist layer R1 is removed by, for example, a known method.

Figure 7:
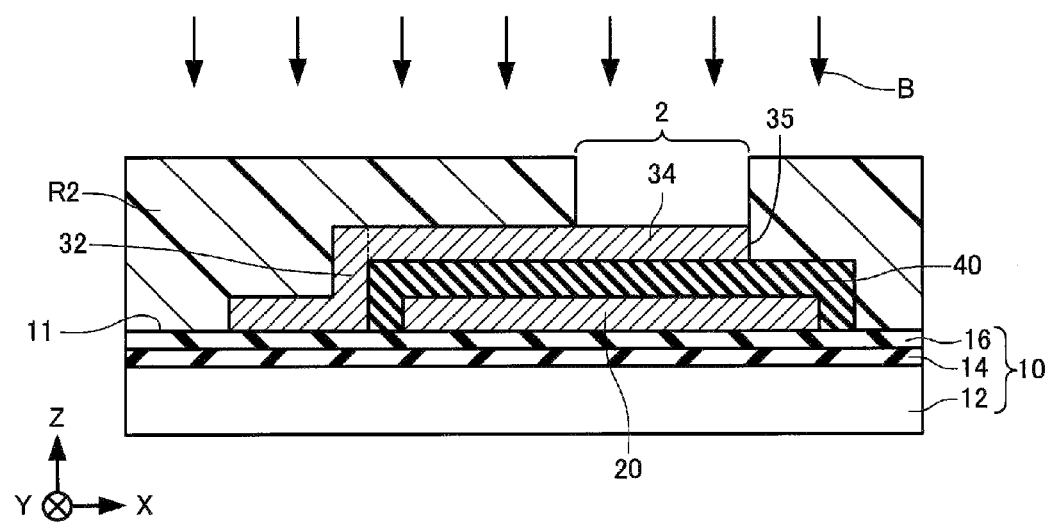
FIG. 7 is a cross-sectional view schematically showing a manufacturing step of the MEMS vibrator according to the embodiment.

As shown in FIG. 7, a second resist layer R2 having a second opening 2 is formed on the beam portion 34 by, for example, a known method. In the illustrated example, the end of the second opening 2 overlaps the tip 35 of the beam portion 34. The length of the second opening 2 in the X-axis direction is smaller than the length of the first opening 1 in the X-axis direction.

Next, the beam portion 34 is doped with the predetermined impurity B using the second resist layer R2 as a mask (a second doping step for the beam portion 34). The concentration of the impurity B to be doped in the second doping step may be the same as the concentration of the impurity B doped in the first doping step. Thereafter, the second resist layer R2 is removed by, for example, a known method.

Figure 8:
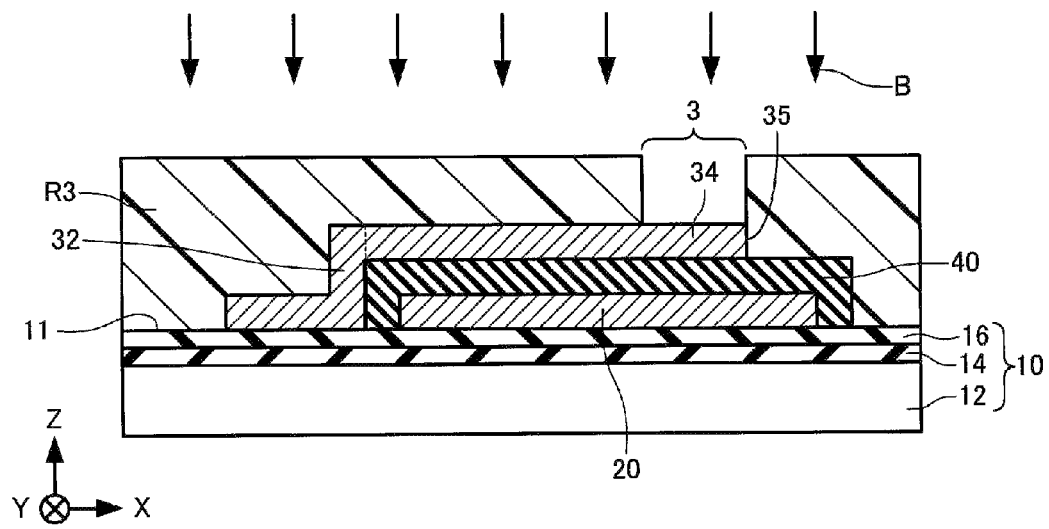
FIG. 8 is a cross-sectional view schematically showing a manufacturing step of the MEMS vibrator according to the embodiment.

As shown in FIG. 8, a third resist layer R3 having a third opening 3 is formed on the beam portion 34 by, for example, a known method. In the illustrated example, the end of the third opening 3 overlaps the tip 35 of the beam portion 34. The length of the third opening 3 in the X-axis direction is smaller than the length of the second opening 2 in the X-axis direction.

Next, the beam portion 34 is doped with the predetermined impurity B using the third resist layer R3 as a mask (a third doping step for the beam portion 34). The concentration of the impurity B to be doped in the third doping step may be the same as the concentration of the impurity B doped in the second doping step. Thereafter, the third resist layer R3 is removed by, for example, a known method.

Through the first to third doping steps described above, the impurity concentration is high in the beam portion 34 on the side of the tip 35, while the impurity concentration is low in the beam portion 34 on the side of the supporting portion 32. In this manner, the distribution of the impurity concentration can be formed in the beam portion 34.

As shown in FIG. 1, the sacrificial layer 40 is removed (release step). The removal of the sacrificial layer 40 is performed by, for example, wet etching using hydrofluoric acid, buffered hydrofluoric acid (a mixed solution of hydrofluoric acid and ammonium fluoride), or the like. In the release step, the second under layer 16 can function as an etching stopper layer.

In the release step, a portion having a high impurity concentration is likely to be etched (etching rate is high), while a portion having a low impurity concentration is unlikely to be etched (etching rate is low). Accordingly, the beam portion 34 on the side of the tip 35 where the impurity concentration is high is likely to be etched, while the beam portion 34 on the side of the supporting portion 32 where the impurity concentration is low is unlikely to be etched. Therefore, it is possible to form the first portion 36 whose length T in the Z-axis direction decreases toward the tip 35 of the beam portion 34 (toward the +X-direction).

In the above description, doping is selectively performed on the beam portion 34 three times. However, the number of times of doping is not particularly limited as long as it is two or more times. By increasing the number of times of the above-described patterning-doping step for the beam portion 34, the inclined face 37 of the first portion 36 can be formed smoothly. That is, it is possible to form the first portion 36 whose length T in the Z-axis direction monotonically decreases toward the tip 35. The doped impurity is diffused in the beam portion 34. Therefore, when the patterning-doping step for the beam portion 34 is repeated about two times, the inclined face 37 can be sufficiently smoothly formed.

Moreover in the above description, a case is described in which the resist layer R1 having the first opening 1 being large in size is first formed and then the resist layers having the openings being progressively reduced in size are formed. However, doping may be performed such that the resist layer R3 having the third opening 3 being small in size is first formed and then the resist layers having the openings being progressively increased in size are formed.

Through the steps described above, the MEMS vibrator 100 can be manufactured.

According to the manufacturing method of the MEMS vibrator 100, it is possible to form the MEMS vibrator 100 having high output and driven at a high frequency as described above.

3. Modified Examples of Mems Vibrator

3.1. MEMS Vibrator According to First Modified Example

Figure 9:
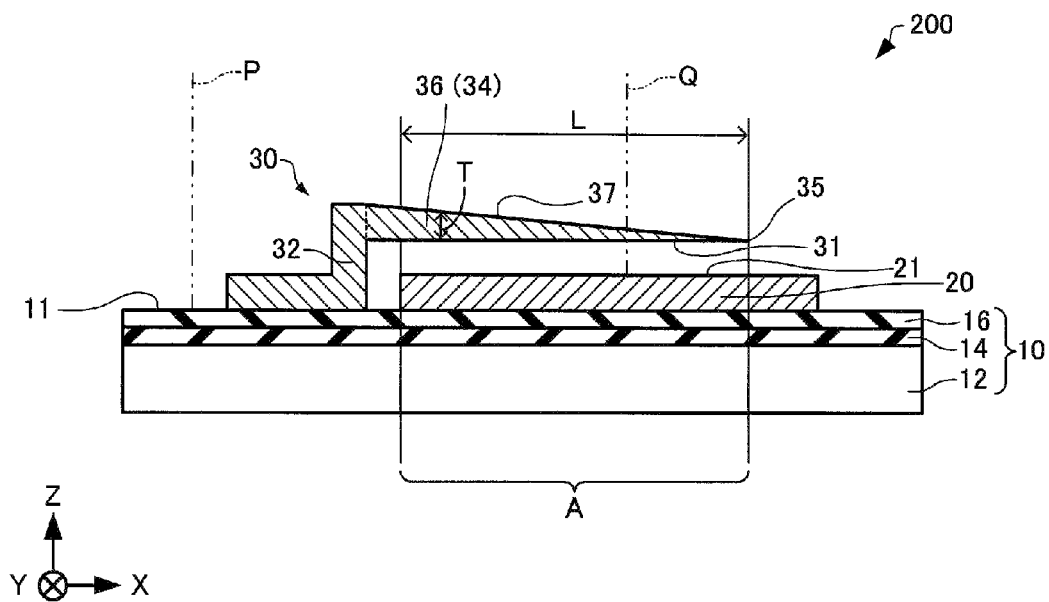
FIG. 9 is a cross-sectional view schematically showing a MEMS vibrator according to a first modified example of the embodiment.

Next, a MEMS vibrator according to a first modified example of the embodiment will be described with reference to the drawing. FIG. 9 is a cross-sectional view schematically showing a MEMS vibrator 200 according to the first modified example of the embodiment, corresponding to FIG. 1. Hereinafter, in the MEMS vibrator 200 according to the first modified example of the embodiment, members having functions similar to those of the constituent members of the MEMS vibrator 100 according to the embodiment are denoted by the same reference numerals and signs, and the detailed descriptions thereof are omitted.

In the example of the MEMS vibrator 100 as shown in FIG. 1, the beam portion 34 has the second portion 38 whose length T in the Z-axis direction is constant. In contrast to this, in the MEMS vibrator 200 as shown in FIG. 9, the beam portion 34 does not have the second portion 38 but is composed of the first portion 36 whose length T in the Z-axis direction decreases toward the tip 35 of the beam portion 34.

According to the MEMS vibrator 200, it is possible similarly to the MEMS vibrator 100 to reduce the mass of the beam portion 34 without reducing the capacitance between the first electrode 20 and the beam portion 34. Accordingly, the MEMS vibrator 200 has high output and can be driven at a high frequency.

A manufacturing method of the MEMS vibrator 200 is basically the same as the manufacturing method of the MEMS vibrator 100. Accordingly, the description thereof is omitted.

3.2. MEMS Vibrator According to Second Modified Example

Figure 10:
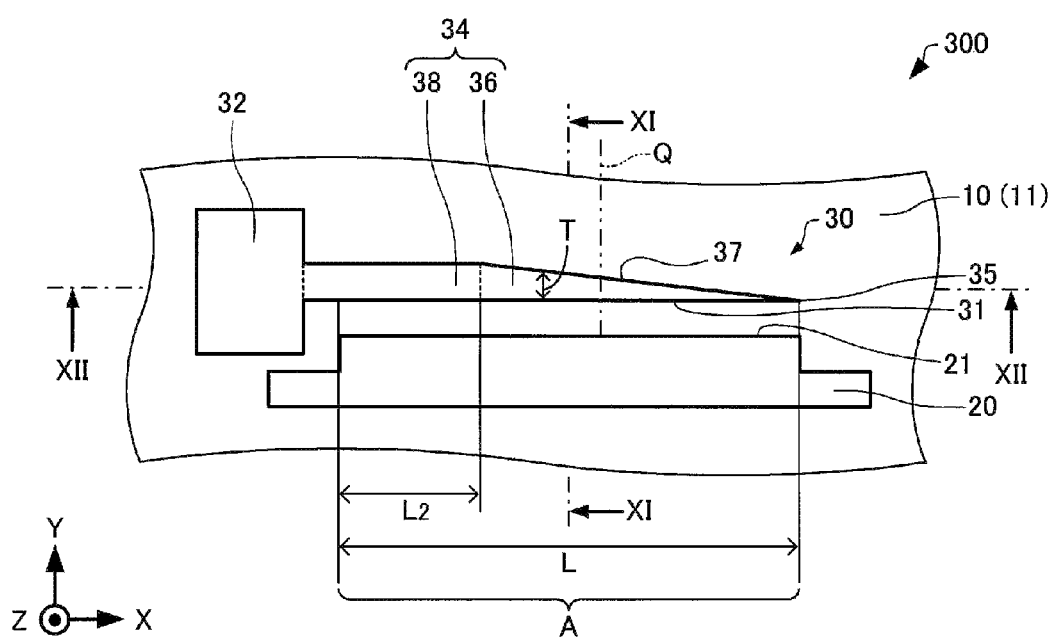
FIG. 10 is a plan view schematically showing a MEMS vibrator according to a second modified example of the embodiment.
Figure 11:
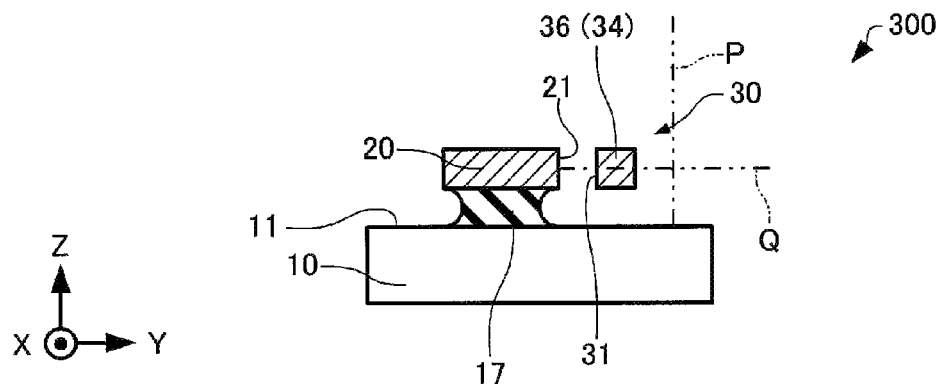
FIG. 11 is a cross-sectional view schematically showing the MEMS vibrator according to the second modified example of the embodiment.
Figure 12:
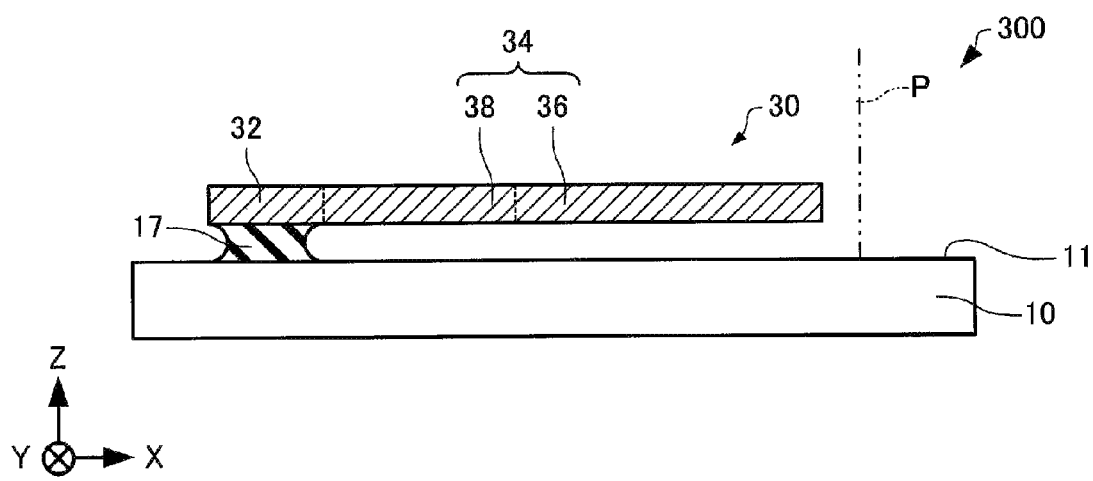
FIG. 12 is a cross-sectional view schematically showing the MEMS vibrator according to the second modified example of the embodiment.

Next, a MEMS vibrator according to a second modified example of the embodiment will be described with reference to the drawings. FIG. 10 is a plan view schematically showing a MEMS vibrator 300 according to the second modified example of the embodiment. FIG. 11 is a cross-sectional view taken along line XI-XI of FIG. 10 schematically showing the MEMS vibrator 300 according to the second modified example of the embodiment. FIG. 12 is a cross-sectional view taken along line XII-XII of FIG. 10 schematically showing the MEMS vibrator 300 according to the second modified example of the embodiment. Hereinafter, in the MEMS vibrator 300 according to the second modified example of the embodiment, members having functions similar to those of the constituent members of the MEMS vibrator 100 according to the embodiment are denoted by the same reference numerals and signs, and the detailed descriptions thereof are omitted.

In the example of the MEMS vibrator 100 as shown in FIG. 1, the normal Q of the first face 21 of the first electrode 20 is parallel to the normal P of the surface 11 of the substrate 10. In the MEMS vibrator 100, the beam portion 34 can vibrate in the Z-axis direction parallel to the normal P of the surface 11.

In contrast to this, in the MEMS vibrator 300 as shown in FIG. 11, the normal Q of the first face 21 of the first electrode 20 is perpendicular to the normal P of the surface 11 of the substrate 10. In the MEMS vibrator 300, the beam portion 34 can vibrate in the Y-axis direction perpendicular to the normal P of the surface 11.

In the MEMS vibrator 300, a semiconductor substrate such as a silicon substrate, for example, can be used as the substrate 10.

As shown in FIG. 11, the first electrode 20 is fixed to the surface 11 of the substrate 10 via an insulating layer 17. In the MEMS vibrator 300 as shown in FIGS. 10 and 11, the first face 21 of the first electrode 20 can be referred to as a side face of the first electrode 20. The material of the insulating layer 17 is, for example, silicon oxide. The thickness (length in the Z-axis direction) of the insulating layer 17 is, for example, from 0.01 μm to 100 μm.

As shown in FIG. 12, the supporting portion 32 of the second electrode 30 is fixed to the surface 11 of the substrate 10 via the insulating layer 17. The beam portion 34 is formed above the substrate 10 with a gap disposed between the beam portion and the substrate 10. As shown in FIGS. 10 and 11, the second face 31 of the beam portion 34 can be referred to as a side face of the beam portion 34. The cross-sectional shape of the second electrode 30 is, for example, a quadrilateral as shown in FIGS. 11 and 12.

As shown in FIG. 10, the first portion 36 of the beam portion 34 has a shape in which the length T (length in the Y-axis direction) in the normal-Q-direction of the first face 21 of the first electrode 20 decreases toward the tip 35 of the beam portion 34 (toward the +X-direction). In the illustrated example, the length T of the first portion 36 in the Y-axis direction monotonically decreases toward the tip 35. That is, as shown in FIG. 10, the first portion 36 may be configured such that the length T in the Y-axis direction does not remain the same in any section on the way from the supporting portion 32 toward the tip 35 but continuously changes toward the tip 35. In short, the first portion 36 can have the inclined face 37 which is inclined to the first face 21 and the second face 31. The planar shape of the first portion 36 may be a triangle. The first portion 36 can include the tip 35.

The first portion 36 is arranged in the region A overlapping the first electrode 20. That is, the first portion 36 is arranged inside the outer circumference of the first electrode 20 as viewed from the normal-Q-direction of the first face 21.

As shown in FIG. 10, the length (length in the Y-axis direction) of the second portion 38 in the normal-Q-direction of the first face 21 of the beam portion 34 is constant. The second portion 38 is contiguous with the first portion 36 and supported by the supporting portion 32. The second portion 38 is adjacent to, for example, the supporting portion 32. The planar shape of the second portion 38 may be a rectangle as shown in FIG. 10. In the illustrated example, a portion of the second portion 38 is arranged in the region A of the beam portion 34 overlapping the first electrode 20.

It is preferable that the ratio ($L_2/L$) of the length $L_2$ of the region A of the second portion 38 overlapping the first electrode 20, in the direction from the supporting portion 32 toward the tip 35 (the X-axis direction), to the length L of the region A of the beam portion 34 overlapping the first electrode 20, in the X-axis direction, satisfies the expression (1). With this configuration, the MEMS vibrator 300 can be driven at a higher frequency (the details will be described later).

According to the MEMS vibrator 300, it is possible similarly to the MEMS vibrator 100 to reduce the mass of the beam portion 34 without reducing the capacitance between the first electrode 20 and the beam portion 34. Accordingly, the MEMS vibrator 300 has high output and can be driven at a high frequency.

Figure 13:
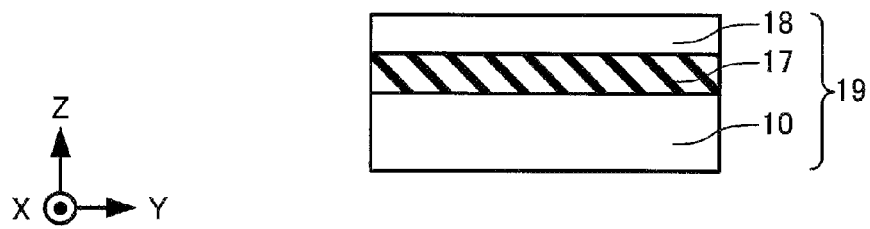
FIG. 13 is a cross-sectional view schematically showing a manufacturing step of the MEMS vibrator according to the second modified example of the embodiment.
Figure 14:
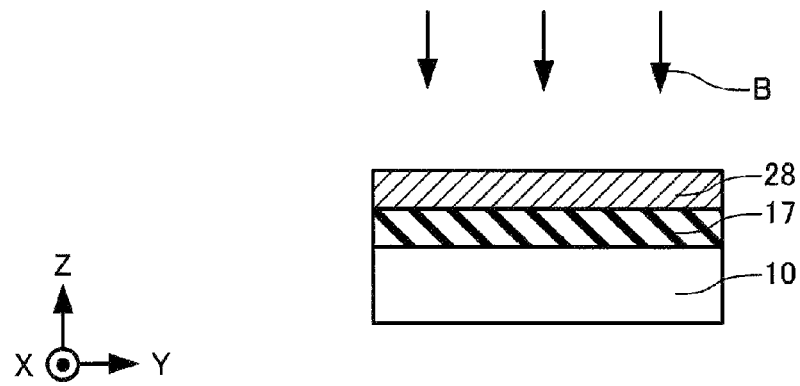
FIG. 14 is a cross-sectional view schematically showing a manufacturing step of the MEMS vibrator according to the second modified example of the embodiment.

Next, a manufacturing method of the MEMS vibrator 300 according to the second modified example of the embodiment will be described with reference to the drawings. FIGS. 13 and 14 are cross-sectional views schematically showing manufacturing steps of the MEMS vibrator 300 according to the second modified example of the embodiment. FIGS. 13 and 14 correspond to FIG. 11.

As shown in FIG. 13, an SOI (Silicon On Insulator) substrate 19 including the substrate 10, the insulating layer 17 formed on the substrate 10, and a silicon layer 18 formed on the insulating layer 17 is prepared.

As shown in FIG. 14, the silicon layer 18 is doped with the predetermined impurity B. With this doping, the silicon layer 18 can be converted to a conductive layer 28 provided with conductivity.

Figure 15:
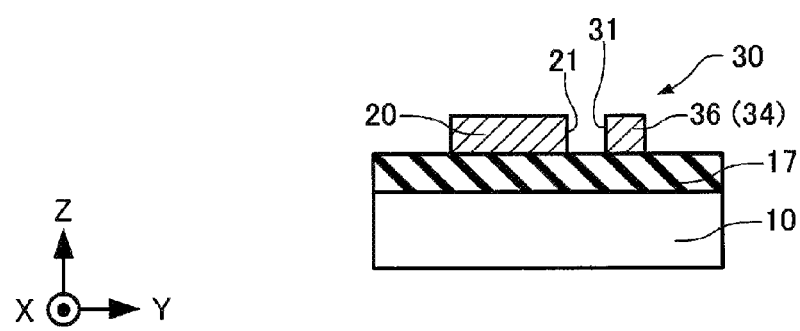
FIG. 15 is a cross-sectional view schematically showing a manufacturing step of the MEMS vibrator according to the second modified example of the embodiment.

As shown in FIG. 15, the conductive layer 28 is patterned using a photolithographic technique and an etching technique to form the first electrode 20 and the second electrode 30 having the supporting portion 32 and the beam portion 34. By the patterning, it is possible to form the first portion 36 whose length T in the Y-axis direction decreases toward the tip 35 of the beam portion 34, and the second portion 38 whose length T in the Y-axis direction is constant. Etching in the patterning may be performed using, for example, inductively coupled plasma reactive ion etching (ICP-RIE), or may be performed by the so-called Bosch process in which etching and etching sidewall passivation are repeated. When etching is performed by the Bosch process for example, isotropic etching is performed using sulfur hexafluoride ($SF_6$) in an etching step, and the sidewall is passivated using a teflon (registered trademark) based gas ($C_4F_8$ or the like) in a passivation step, making it possible to suppress etching in the lateral direction (the X-axis direction and the Y-axis direction).

As shown in FIGS. 11 and 12, the insulating layer 17 is etched using the first electrode 20 and the second electrode 30 as masks. By the etching, the insulating layer 17 below the beam portion 34 is removed. The insulating layer 17 below the first electrode 20 and the supporting portion 32 is not removed but side-etched in the illustrated example. Although not shown in the drawing, a through-hole penetrating from an upper face to a lower face of the beam portion 34 may be formed for reliably removing the insulating layer 17 below the beam portion 34.

Through the steps described above, the MEMS vibrator 300 can be manufactured.

According to the manufacturing method of the MEMS vibrator 300, the beam portion 34 having the first portion 36 and the second portion 38 can be formed by patterning using a photolithographic technique and an etching technique. Accordingly, according to the manufacturing method of the MEMS vibrator 300, the MEMS vibrator 300 having high output and driven at a high frequency can be formed by a simple method compared to, for example, the manufacturing method of the MEMS vibrator 100.

3.3. MEMS Vibrator According to Third Modified Example

Figure 16:
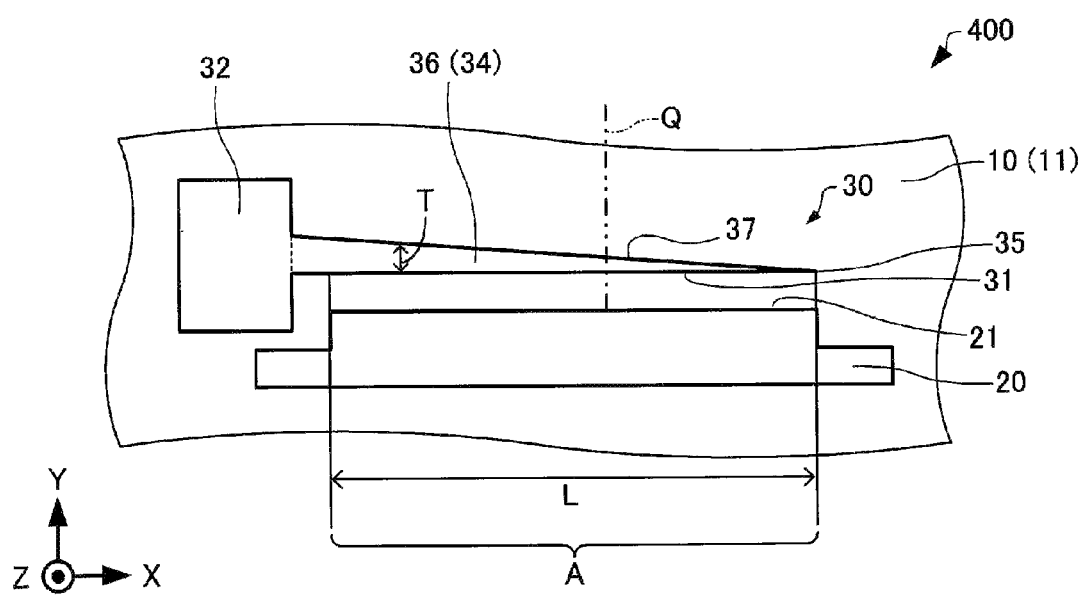
FIG. 16 is a plan view schematically showing a MEMS vibrator according to a third modified example of the embodiment.

Next, a MEMS vibrator according to a third modified example of the embodiment will be described with reference to the drawing. FIG. 16 is a cross-sectional view schematically showing a MEMS vibrator 400 according to the third modified example of the embodiment, corresponding to FIG. 10. Hereinafter, in the MEMS vibrator 400 according to the third modified example of the embodiment, members having functions similar to those of the constituent members of the MEMS vibrator 300 according to the second modified example of the embodiment are denoted by the same reference numerals and signs, and the detailed descriptions thereof are omitted.

In the example of the MEMS vibrator 300 as shown in FIG. 10, the beam portion 34 has the second portion 38 whose length T in the Y-axis direction is constant. In contrast to this, in the MEMS vibrator 400 as shown in FIG. 16, the beam portion 34 does not have the second portion 38 but is composed of the first portion 36 whose length T in the Y-axis direction decreases toward the tip 35 of the beam portion 34.

According to MEMS vibrator 400, it is possible similarly to the MEMS vibrator 300 to reduce the mass of the beam portion 34 without reducing the capacitance between the first electrode 20 and the beam portion 34. Accordingly, the MEMS vibrator 400 has high output and can be driven at a high frequency.

A manufacturing method of the MEMS vibrator 400 is basically the same as the manufacturing method of the MEMS vibrator 300. Accordingly, the description thereof is omitted.

4. Experimental Examples

Next, experimental examples of the MEMS vibrator according to the embodiment will be described with reference to the drawings. The invention is not limited at all by the following experimental examples.

As the experimental examples, simulations in which the MEMS vibrator according to the embodiment is modeled were performed. In the simulations, frequencies were measured while changing the shape of a beam portion of a MEMS vibrator. The simulations were performed using I-DEAS (manufactured by Siemens PLM Software).

In the simulations shown below, members having functions similar to those of the constituent members of the MEMS vibrator 100 according to the embodiment are denoted by the same reference numerals and signs, and the detailed descriptions thereof are omitted. In the simulations shown below, a beam portion corresponds to the beam portion located in the region A overlapping the first electrode 20 (for example, refer to FIG. 1). In the simulations shown below, the Young's modulus of the beam portion is 123.2 GPa, and the density of the beam portion is 2230 kg/m³.

4.1. First Simulation

Figure 17:
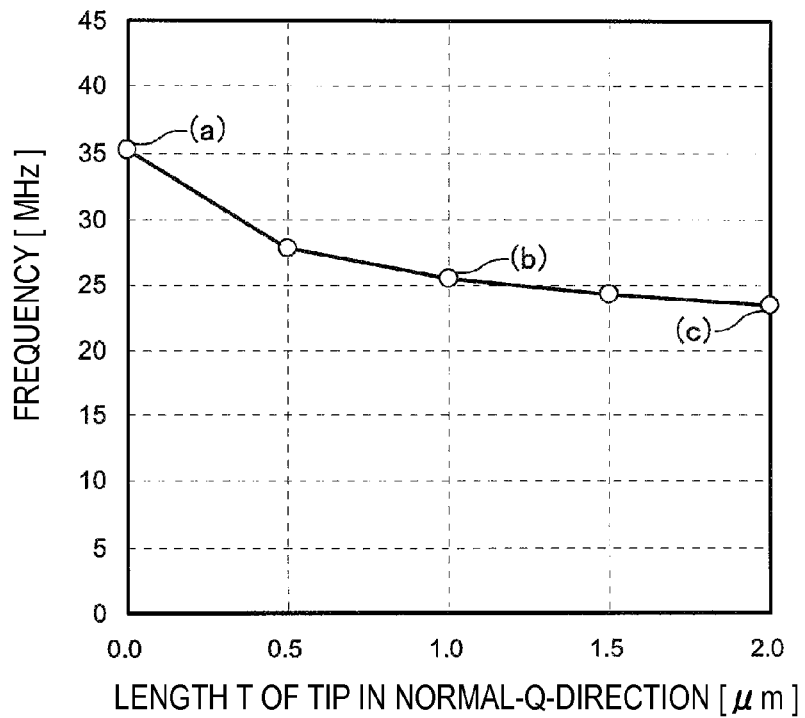
FIG. 17 is a graph showing the results of a first simulation in an experimental example.
Figure 18:
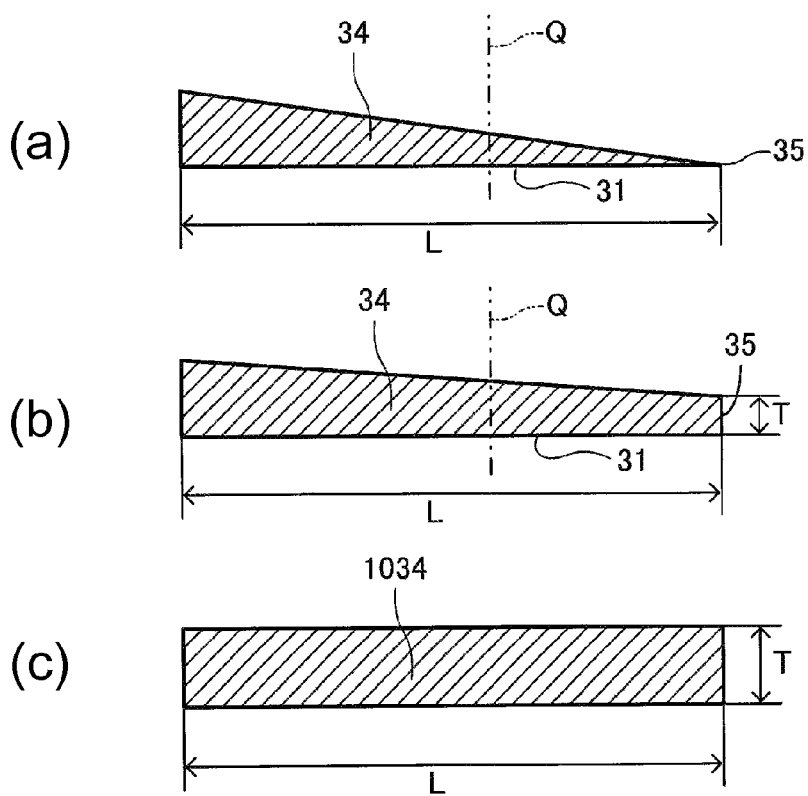
FIGS. 18A to 18C each schematically show a beam portion used for the first simulation in the experimental example.

FIG. 17 is a graph showing the results of a first simulation. In the first simulation, a frequency with respect to the length T of a tip of the beam portion in the normal-Q-direction was obtained. That is, in FIG. 17, the plotted point (a) obtained when T=0 μm represents the value of a triangle-shaped beam portion 34 as viewed from a direction perpendicular to the normal Q as shown in FIG. 18A. In FIG. 17, the plotted point (b) obtained when T=1 μm represents the value of a trapezoid-shaped beam portion 34 as shown in FIG. 18B. In FIG. 17, the plotted point (c) obtained when T=2 μm represents the value of a rectangle-shaped beam portion 1034 (beam portion 1034 according to a comparative example) as shown in FIG. 18C.

Since the first face 21 of the first electrode 20 and the second face 31 of the beam portion 34 are parallel to each other (for example, refer to FIG. 1), the normal Q is illustrated as the normal of the second face 31 in FIGS. 18A and 18B. In the first simulation, the length L of the beam portion perpendicular to the normal Q is 10 μm, and the length (corresponding to W shown in FIG. 2) of the beam portion perpendicular to the directions of the normal Q and the length L is 2 μm. The same applies to a second simulation.

It is found from FIG. 17 that the beam portions 34 (refer to FIGS. 18A and 18B) whose lengths in the normal-Q-direction decrease toward the tip 35 are high in frequency compared to the rectangle-shaped beam portion 1034 (refer to FIG. 18C).

4.2. Second Simulation

Figure 19:
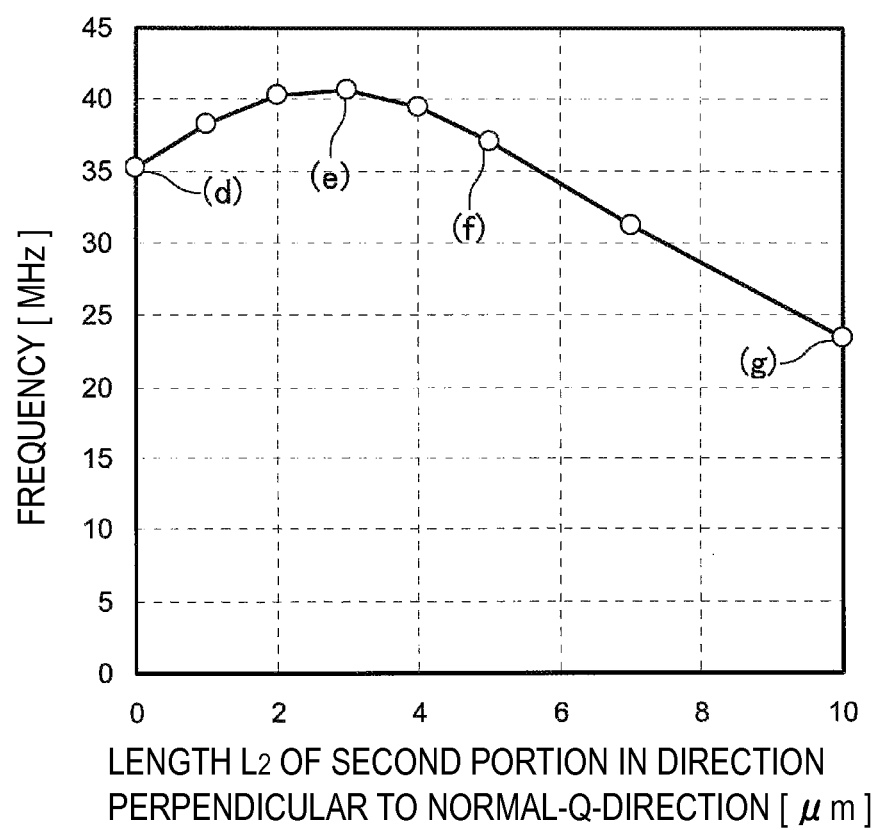
FIG. 19 is a graph showing the results of a second simulation in an experimental example.
Figure 20:
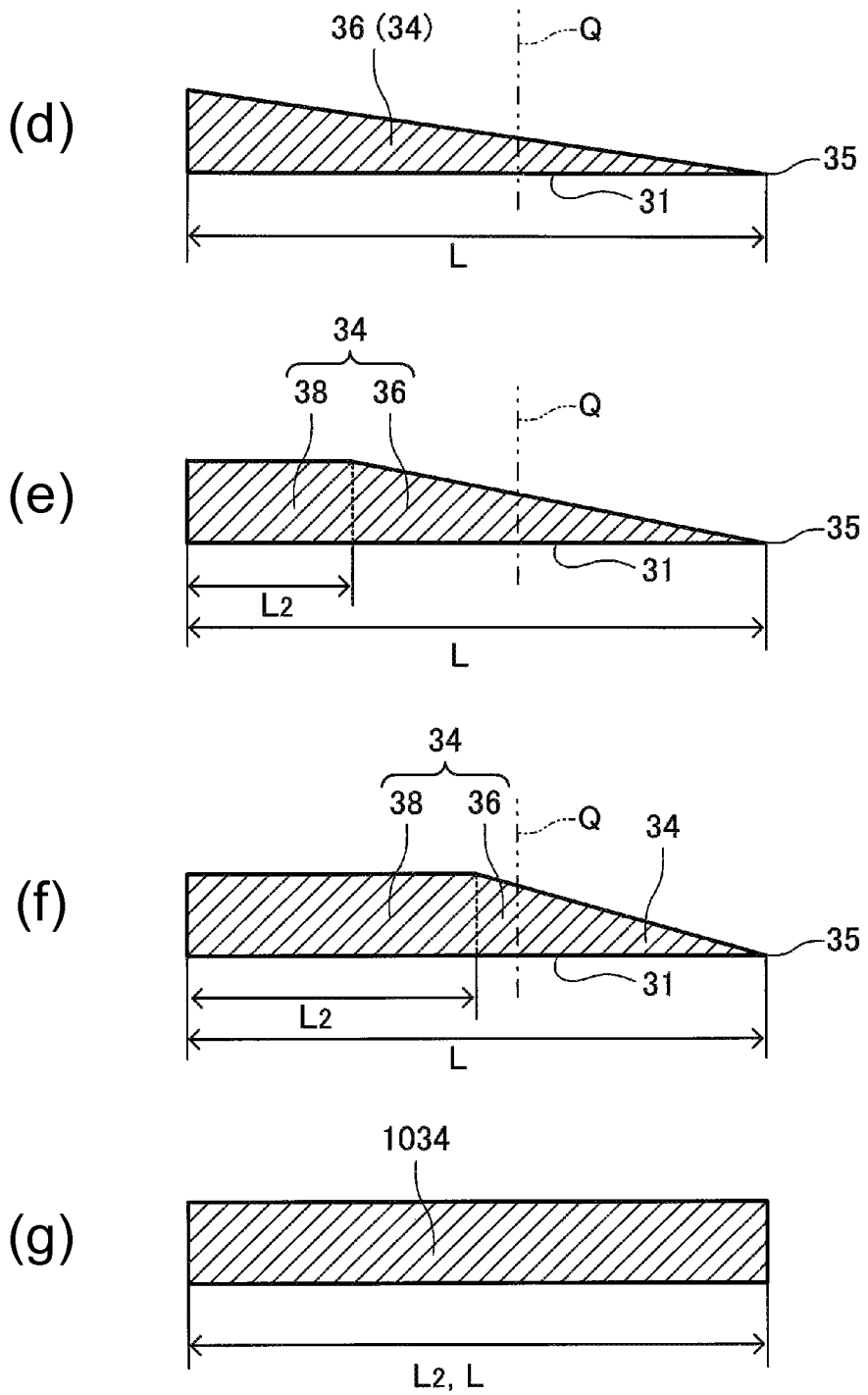
FIGS. 20D to 20G each schematically show a beam portion used for the second simulation in the experimental example.

FIG. 19 is a graph showing the results of the second simulation. In the second simulation, a frequency with respect to the length $L_2$ of a second portion (portion whose length in the normal-Q-direction is constant) of a beam portion in the direction perpendicular to the normal Q was obtained. That is, in FIG. 19, the plotted point (d) obtained when $L_2$=0 μm represents the value of a triangle-shaped beam portion 34 as viewed from the direction perpendicular to the normal Q as shown in FIG. 20D. The beam portion 34 does not have the second portion 38 whose length in the normal-Q-direction is constant. In FIG. 19, the plotted point (e) obtained when $L_2$=3 μm represents the value of a trapezoid-shaped beam portion 34 as shown in FIG. 20E. In FIG. 19, the plotted point (f) obtained when $L_2$=5 μm represents the value of a trapezoid-shaped beam portion 34 as shown in FIG. 20F. In FIG. 19, the plotted point (g) obtained when $L_2$=10 μm represents the value of a rectangle-shaped beam portion 1034 (beam portion 1034 according to a comparative example) as shown in FIG. 20G. In the second simulation, the length of the second portion 38 in the normal-Q-direction is 2 μm.

It is found from FIG. 19 that the beam portions 34 (refer to FIGS. 20D, 20E, and 20F) having the first portions 36 whose lengths in the normal-Q-direction decrease toward the tip 35 are high in frequency compared to the rectangle-shaped beam portion 1034 (refer to FIG. 20G).

It is further found from FIG. 19 that the beam portions 34 having the second portions 38 whose lengths $L_2$ fall within a range from 1 μm to 5 μm are high in frequency compared to the beam portion 34 whose length $L_2$=0 μm (that is, the beam portion 34 without the second portion 38). In short, it is found that, by setting the value of $L_2$ to L ($L_2$/L) to from 1/10 to 1/2 (that is, by satisfying the expression (1)), driving at a higher frequency is possible. It is supposed that the frequency is increased by satisfying the expression (1) for the reason that, within the range of the expression (1), the spring constant can be assured to some extent while reducing the mass of the beam portion 34. That is, it is supposed that, within the range of the expression (1), the balance between the mass and the spring constant is suitable for obtaining a high frequency.

The results of the first and second simulations do not depend on parameters such as the density or Young's modulus of the beam portion 34, or the length of the second portion 38 in the normal-Q-direction, and are applicable. Even when these parameters change, the results indicate a similar tendency. Moreover, the results of the first and second simulations described above are not limited to the form in which, like the MEMS vibrator 100 for example, the beam portion 34 vibrates in the direction parallel to the normal P of the surface 11 of the substrate 10, but can be applied to the form in which, like the MEMS vibrator 300 for example, the beam portion 34 vibrates in the direction perpendicular to the normal P. Even when the direction of vibration of the beam portion 34 changes, the results indicate a similar tendency.

5. Oscillator

Figure 21:
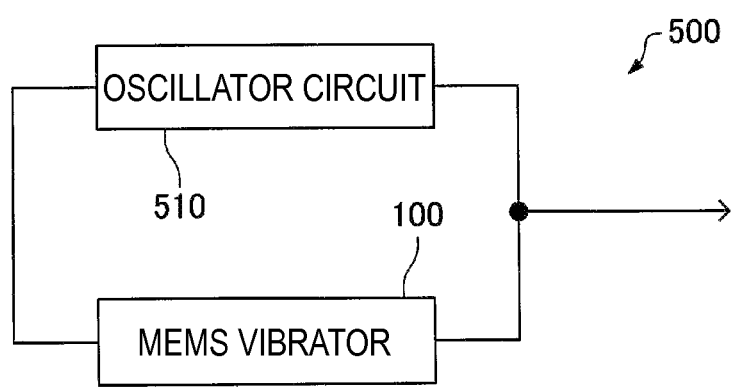
FIG. 21 schematically shows an oscillator according to the embodiment.

Next, an oscillator according to the embodiment will be described with reference to the drawing. FIG. 21 schematically shows an oscillator 500 according to the embodiment.

As shown in FIG. 21, the oscillator 500 includes the MEMS vibrator (for example, the MEMS vibrator 100) according to the invention and an oscillator circuit 510.

The oscillator circuit 510 is electrically connected to the MEMS vibrator 100. When a voltage is applied between the electrodes 20 and 30 of the MEMS vibrator 100 from the oscillator circuit 510, the beam portion 34 can be vibrated by electrostatic force generated between the electrodes 20 and 30. Then, the MEMS vibrator 100 can oscillate at a resonant frequency with the oscillator circuit 510.

Transistors, capacitors (both not shown), and the like of which the oscillator circuit 510 is composed may be formed on, for example, the supporting substrate 12 (refer to FIG. 1). With this configuration, the MEMS vibrator 100 and the oscillator circuit 510 can be formed monolithically.

When the MEMS vibrator 100 and the oscillator circuit 510 are formed monolithically, members such as transistors of which the oscillator circuit 510 is composed may be formed in the same step as that of forming the MEMS vibrator 100 described above. Specifically, in the step of forming the sacrificial layer 40 (refer to FIG. 4), a gate insulating layer of the transistors may be formed. Further, in the step of forming the second electrode 30 (refer to FIG. 5), gate electrodes of the transistors may be formed. In this manner, the manufacturing steps are commonly used for the MEMS vibrator 100 and the oscillator circuit 510, whereby the manufacturing steps can be simplified.

According to the oscillator 500, the MEMS vibrator 100 having high output and driven at a high frequency is included. Therefore, in the oscillator 500, the series resistance can be prevented from being increased, and the phase can be reversed. Accordingly, the oscillator 500 can satisfy oscillation conditions, and therefore can stably oscillate the MEMS vibrator 100 at a high frequency.

The embodiment and modified examples described above are illustrative only, and the invention is not limited to them. For example, it is also possible to appropriately combine the embodiment and the modified examples.

While the embodiment of the invention has been described above in detail, those skilled in the art should readily understand that many modifications can be made without departing in substance from the novel matter and effects of the invention. Accordingly, all of those modified examples are deemed to be included in the scope of the invention.

The entire disclosure of Japanese Patent Application No. 2011-075808, filed Mar. 30, 2011 is expressly incorporated by reference herein.

What is claimed is:

1. A MEMS vibrator comprising:
a first electrode fixed to a surface of a substrate and including a first face; and
a second electrode having a beam portion including a second face facing the first face, and a supporting portion supporting the beam portion and fixed to the surface of the substrate, wherein
the beam portion has a first portion whose length, as viewed from a normal direction of the first face, monotonically decreases toward a tip of the beam portion.

2. The MEMS vibrator according to claim 1, wherein the first face is flat.

3. The MEMS vibrator according to claim 1, wherein
the beam portion has a second portion whose length in the normal direction of the beam portion is constant,
the first portion includes the tip,
the second portion is contiguous with the first portion and supported by the supporting portion, and
the MEMS vibrator satisfies the following expression (1):

$$1/10 \le L_2/L \le 1/2 \qquad (1)$$

where L is the length of a region of the beam portion overlapping the first electrode, in a direction from the supporting portion toward the tip, and $L_2$ is the length of a region of the second portion overlapping the first electrode, in the direction from the supporting portion toward the tip.

4. The MEMS vibrator according to claim 1, wherein
the normal of the first face is parallel to the normal of the surface of the substrate.

5. The MEMS vibrator according to claim 1, wherein,
the normal of the first face is perpendicular to the normal of the surface of the substrate.

6. An oscillator comprising the MEMS vibrator according to claim 1.

7. An oscillator comprising:
the MEMS vibrator according to claim 1; and
an oscillator circuit.

8. The oscillator according to claim 7, wherein
the oscillator circuit has a transistor and a capacitor, and
the MEMS vibrator, the transistor, and the capacitor are formed monolithically on the substrate.

9. A MEMS vibrator comprising:
a first electrode fixed to a substrate surface; and
a second electrode having a beam portion facing the first electrode, and a supporting portion supporting the beam portion and fixed to the substrate surface, wherein
the beam portion has a first portion whose length, as viewed from a vertical direction with respect to the substrate surface, monotonically decreases toward a tip of the beam portion.

* * * * *